ETCH STOP FOR KOH ANISOTROPIC ETCH

Filed Aug. 13, 1971 2 Sheets-Sheet 1

INVENTOR
Robert G. Hays
Chongkook Rhee
BY
Mueller & Aichele
ATTY'S.

INVENTOR
Robert G. Hays
BY Chongkook Rhee
Mueller & Aichele
ATTY'S.

United States Patent Office 3,721,593
Patented Mar. 20, 1973

3,721,593
ETCH STOP FOR KOH ANISOTROPIC ETCH

Robert G. Hays and Chongkook Rhee, Scottsdale, Ariz., assignors to Motorola, Inc., Franklin Park, Ill.

Filed Aug. 13, 1971, Ser. No. 171,455
Int. Cl. H01l 7/50
U.S. Cl. 156—17 5 Claims

ABSTRACT OF THE DISCLOSURE

The etch rate of boron doped silicon by a potassium hydroxide anisotropic etch solution varies with the doping level. Thus an etch stop for KOH anistropic etch for silicon is disclosed comprising a layer of silicon doped with boron to a suface concentration level of about $5 \times 10^{19}$ atoms of boron per cc. Preferably the surface concentration of boron is greater than $5 \times 10^{19}$ atoms per cc., for example $1 \times 10^{20}$ atom per cc. for best results.

RELATED APPLICATIONS

This application is related to the application of the same inventors entitled "Thin Single Crystal Silicon on an Insulating Substrate and the Like," Ser. No. 171,453, filed Aug. 13, 1971 and assigned to the same assignee as the subject invention.

BACKGROUND OF THE INVENTION

Heretofore, it has been believed that the etching of silicon and boron doped silicon in particular, by the anisotropic etchant, potassium hydroxide solution, proceeded at a uniform rate. However, it has been discovered that between certain limits of boron surface concentration in silicon, about $3 \times 10^{18}$ to $3 \times 10^{20}$ atoms per cc., the etching rate varies widely. For example, for a concentration of about $3 \times 10^{18}$ atoms per cc. the etch rate was about .95 micron thickness per minute, while for a concentration of about $3 \times 10^{20}$ atoms of boron per cc. the etch rate was about 0.02 micron per minute. The latter is to say, that in the area of solid solubility of boron in silicon the etch rate is virtually zero. This phenomenon can be utilized to stop the etching action of KOH solution on silicon, for example, in the formation of thin films of silicon of any contour on a supporting substrate. As a practical matter a boron concentration of about $5 \times 10^{19}$ atoms per cc. or higher is needed to give a usable difference in etch rate between the silicon substrate and the etch stop.

Accordingly it is an object of the invention to provide an improved etch stop for KOH anisotropic etches for use in connection with the formation of silicon wafers, and it is a further object of the invention to provide an improved process or method for the purpose indicated.

It is a further object of the invention to provide an improved etch stop of the character indicated which is self-limiting in its operation.

It is known to use KOH anisotropic etch to form the grooves in monocrystalline silicon wafers of the <100> crystallographic orientation wherein the KOH anisotropic etch is self-limiting as to the depth of the groove. This process utilizing a silicon dioxide mask is shown in the co-pending application of Uryon S. Davidsohn, Ser. No. 743,251, filed July 8, 1968, now abandoned entitled "Anisotropic Etching of Monocrystalline Silicon" and assigned to the same assignee as the subject application. In the said application, after the triangular grooves have been etched, a layer of silicon dioxide is formed in the grooves and over the adjacent surfaces of the substrate. Thereafter a layer of polycrystalline silicon is formed in the grooves which is of sufficient thickness to provide a supporting structure. Thereafter the original substrate of <100> silicon is removed by polishing techniques or by electrolytic etching until the peaks of the silicon dioxide layer show, whereupon islands, or thin films, of single crystal silicon are provided on a substrate. The process thus disclosed is somewhat time consuming, does not result in as great an accuracy as is desired in the finished product, and does not use an etch stopant.

Accordingly, it is a further object of the invention to provide an improved self-limiting etch process, utilizing KOH anisotropic etch and a heavily doped boron layer to limit the etching process.

The subject invention utilizes the epitaxial process for forming a thin film of single crystal silicon, doped or undoped, and is useful in that the thickness of the film, its resistivity, and its type may be very accurately controlled.

It is also known to hetero-epitaxially grow single crystal silicon on substrates such as sapphire or spinel. But in these instances there is a certain amount of structural dislocation in the silicon because of the similarity of the crystal structure of the sapphire or spinel substrate and the silicon which is grown hetero-epitaxially thereon. Accordingly, it is a further object of the invention to overcome these deficiencies of the known art and to form epitaxial silicon films dielectrically isolated from a substrate.

Accordingly, it is an object of the invention to provide means for stopping the action of KOH anisotropic etch in liquid phase in forming silicon wafers inasmuch as KOH solution does not appreciably attack or etch silicon with a boron doping level (surface concentration) above $5 \times 10^{19}$ atoms per cubic centimeter. The inclusion of a $P^+$ boron doped buried layer with adequate surface concentration can be used as an etch stop in the wafer shaping process. According to the invention, this process is faster, cheaper, simpler and more accurate than mechanical or electrolytic shaping and the process is self-limiting as to etch depth.

SUMMARY OF THE INVENTION

In carrying out the invention in one form, there is provided, in the process of forming a silicon semi-conductive wafer, means for stopping the etching action of the etching agent KOH in liquid phase comprising disposing a layer of silicon with a high doping level of boron in the path of the etching agent.

In carrying out the invention in another form there are provided means for stopping the etching action of KOH in liquid phase comprising a silicon layer doped to a high surface concentration level of boron disposed in the etching path of the KOH, the boron doping level having a surface concentration greater than xxx $5 \times 10^{19}$ atoms per cubic centimeter of silicon. In carrying out the invention according to still another form a KOH anisotropic etch stop is provided comprising a layer of silicon having a doping level of boron of at least xx $5 \times 10^{19}$ atoms per cubic centimeter.

DESCRIPTION OF THE PREFERRED EMBODIMENT

While the structures shown in the figures illustrate one way of utilizing the subject matter of the invention, other structures may of course be devised within the scope of the invention. The concept of the invention is the utilization of a high level boron doping of silicon as an etch stop for the KOH anisotropic etching agent, the surface concentration of boron preferably being greater than $5\times10^{19}$ atoms per cubic centimeter.

Figure 1:
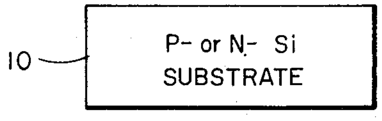
FIG. 1 is a representation on a much enlarged scale of $P^-$ or $N^-$ silicon substrate.
Figure 2:
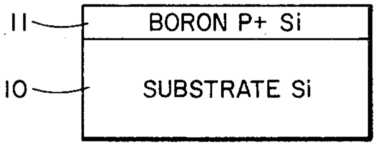
FIG. 2 illustrates the substrate of FIG. 1 after a $P^+$ (boron doped) layer of silicon has been formed thereon.

Referring to the drawings, there is shown a substrate layer 10 of monocrystalline silicon doped, for example, to a $P^-$ or $N^-$ level. The substrate 10 may, for example, be of the crystallographic orientation <100> and may be of any thickness desired to provide sufficient mechanical support for subsequent handling. In FIG. 2, the substrate 10 is shown with a boron doped layer 11 of silicon formed thereon. The layer 11 may be formed by diffusion techniques or by epitaxial growth both being well known, the boron concentration preferably being at least $5\times10^{19}$ atoms per cubic centimeter and can be higher, for example, as high as $1\times10^{20}$ or even higher to the level of solid solubility. It is the discovery of the fact that a silicon layer doped with boron to a surface concentration of $5\times10^{19}$ or greater will act as a significant etch stop for the anisotropic etchant KOH that is a principal feature of the subject invention.

Typically the layer 11 may be of about one to one and one-half microns in thickness.

Figure 3:
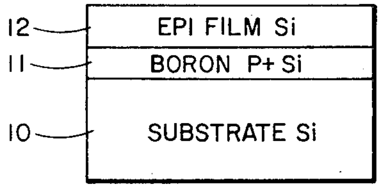
FIG. 3 illustrates the structure of FIG. 2 with an epitaxially formed film of silicon thereon.

In FIG. 3, there is shown formed on the $P^+$ layer 11 an epitaxial film 12 of silicon which may be of any desired thickness, resistivity and type, that is P type or N type as the circumstances may require. The epitaxial film growing technique enables the layer 12 to be very accurately formed as to the desired thickness and concentration of dopant.

Figure 4:
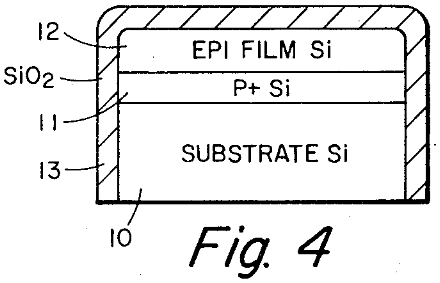
FIG. 4 illustrates the structure of FIG. 3 with a dielectric isolation layer of $SiO_2$ formed around the structure.

In FIG. 4 the structure of FIG. 3 is shown with a layer of dielectric insulating material 13, for example, silicon dioxide. The latter may be grown or deposited on the structure as shown.

Figure 5:
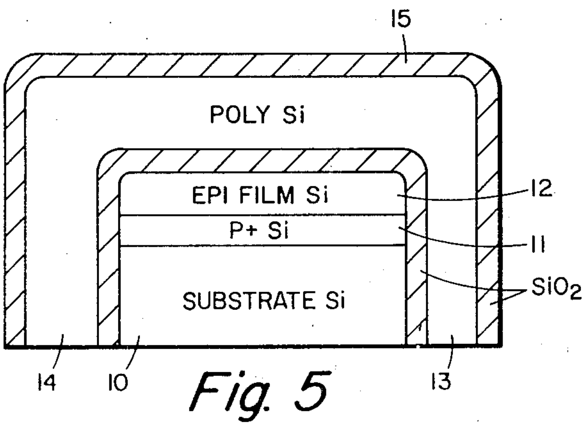
FIG. 5 illustrates the structure of FIG. 4 with a layer of polycrystalline silicon formed thereupon and a further layer of silicon dioxide formed upon the polycrystalline silicon layer.

In subsequent processing it is desired to remove the substrate layer 10, and to facilitate this while preserving the epitaxial film 12, a layer of polycrystalline silicon 14 is deposited around the structure of FIG. 4, as shown in FIG. 5. The layer 14 is of sufficient thickness to provide support for the film 12 during subsequent processing operations. For protection of the supportive material 14 during a subsequent processing a further layer 15 of silicon dioxide may be deposited on the outside surface of the polycrystalline silicon layer 14.

Figure 6:
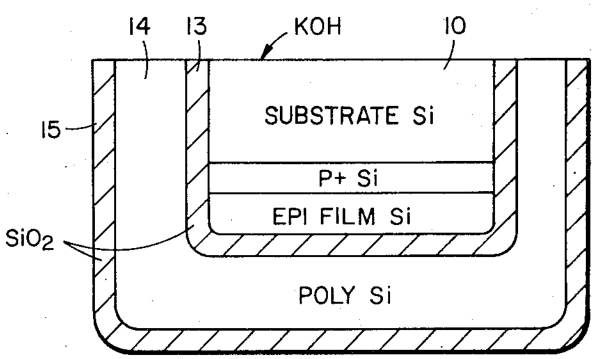
FIG. 6 is the same structure as FIG. 5 but is shown inverted.

In FIG. 6, the structure of FIG. 5 is identical, but is in an inverted position wherein the substrate 10 is uppermost. The $P^+$ layer 11 is a buried layer. In this position the KOH anisotropic etching agent is applied to the substrate 10 and it proceeds to etch away the material of the substrate to the buried etch resistant layer 11 at a rate which is dependent upon the crystallographic orientation of the substrate 10 of silicon. While it has been indicated that the substrate 10 may be of the <100> crystallographic orientation, it will be clear that silicon of the <110> crystallographic orientation may be used. This etches at a slower rate. Silicon of the <111> crystallographic orientation would probably not be used because of its slow etching rate with the KOH etching agent.

Figure 7:
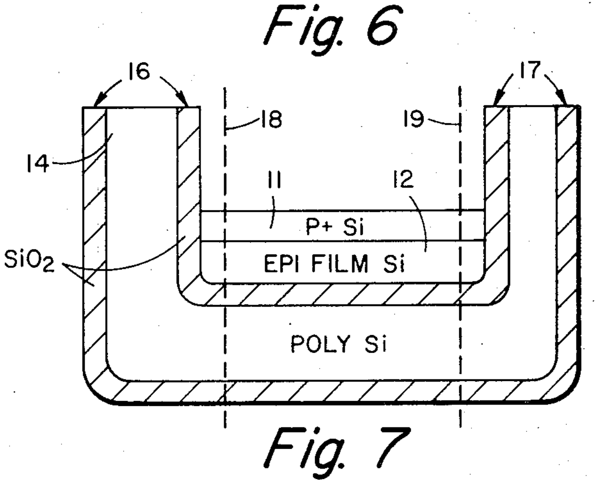
FIG. 7 shows the structure of FIG. 6 with the substrate layer of $P^-$ or $N^-$ silicon etched away.
Figure 8:
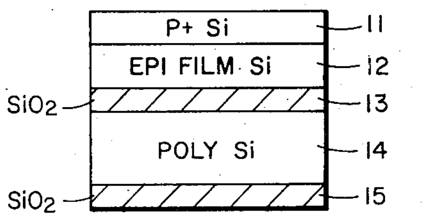
FIG. 8 illustrates the structure of FIG. 7 after portions of the outer layers of silicon dioxide and a portion of the polycrystalline layer has been removed.

FIG. 7 differs from FIG. 6 in that the substrate 10 is completely removed to the boron doped etch resistant layer 11 and the ends 16 and 17. As has been indicated, this layer is doped with boron to a surface concentration of $5\times10^{19}$ atoms per cubic centimeter or greater and thus stops the action of the etchant KOH at the surface of the layer 11. It will be noted that the epitaxial silicon film 12 has been preserved in its original dimensions and characteristics. Referring to FIG. 8, the end portions 16 and 17 of the silicon dioxide layers 13 and 15 and the polycrystalline silicon 14 have been removed as by mechanical shaping to about the dotted lines 18 and 19 (FIG. 7) thereby leaving the structure comprising the $P^+$ layer 11, the epitaxial silicon film 12, a portion of the silicon dioxide layer 13, a portion of the polycrystalline silicon layer 14 and a portion of the silicon dioxide layer 15.

Figure 9:
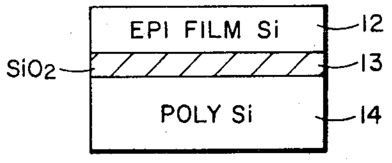
FIG. 9 illustrates the structure of FIG. 8 with the remaining exterior portion of the silicon dioxide layer and the $P^+$ silicon layer removed.

In FIG. 9, the residual $P^+$ layer 11 has been shown removed as by a controlled mechanical polishing or isotropic etching as is well known. Whether controlled mechanical polishing, electrolytic etching or isotropic etching is used, the layer 11 may be accurately removed and the remainder of silicon dioxide layer 15 at the bottom may, if desired, be removed, leaving the supporting handle or substrate portion 14 of polycrystalline silicon. In the event that the residual $P^+$ layer 11 is removed by isotropic etching, any well known etchant may be used whose etching rate is known in order that the process may be stopped when the $P^+$ layer has been completely removed.

The removal of the residual $P^+$ layer 11 can be very accurately done thus preserving the original dimensions and characteristics of the epitaxial film 11. The thickness of the epitaxial film layer 11 which may, for example, be about 5 microns in thickness, may thus be preserved within an accuracy of about one to one and one-half microns from one edge to the other. In addition the silicon dioxide layer 13 remains in order to dielectrically isolated the epitaxial film 11, the polysilicon layer 14 providing the mechanical support. In other processes, as for example, the one referred to in application Ser. No. 743,-251, the accuracy from one side of the wafer to another may be about one-half mil or twelve and one-half microns.

The formulation of the particular mixture of the KOH anisotropic etching agent may be any one that is well known to those skilled in the art and could comprise a mixture of KOH, water and alcohol. One formulation that has been utilized comprised 375 grams of KOH, 1200 cubic centimeters of $H_2O$ and 375 grams of isopropyl alcohol, the solution being used at a temperature of about 80° C. Other mixtures will work, especially those using higher boiling temperature alcohol with more water and less KOH, all of which is well known.

Figure 10:
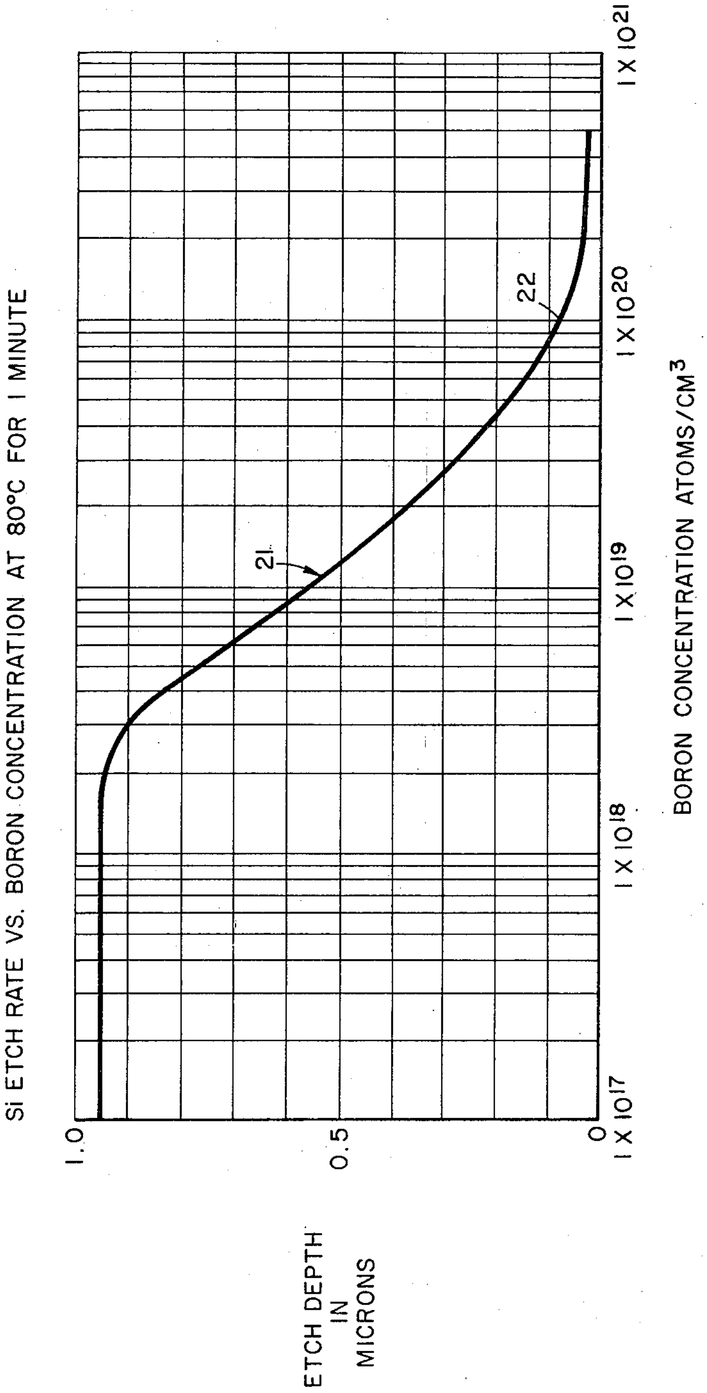
FIG. 10 is a graph illustrating variations in etch rate with boron doping concentration.

In FIG. 10 a plot or graph 21 of the etch rate of boron doped silicon is shown with the etching agent KOH. The coordinates are etching depth in microns and boron concentration in atoms per cc., the etching time in each instance being one minute. Thus for boron concentrations below about $3\times10^{18}$ atoms per cc. the etch rate is independent of concentration and is high, for example, about 9.95 micron per minute; for boron concentrations of about $3.5\times10^{20}$ atoms per cc. (solid solubility) the etch rate is constant and very low, about .02 micron per minute or virtually zero, and between these extremes the rate varies as shown by the graph.

Boron concentrations substantially greater than $1\times10^{20}$ are difficult and time consuming to obtain as a practical matter without severe crystallographic damage whereas the range between abuot $5\times10^{19}$ and $1\times10^{20}$ atoms per cc. and even somewhat greater, the lower knee 22 of the curve 18 take much less time and achieve the major and preferred portions of the inventive advantages.

What is claimed is:

1. In the process forming a silicon semiconductive element, a method for stopping the etching action of the etching agent KOH in liquid phase comprising disposing a layer of high boron doped level silicon with a concentration greater than $5\times10^{19}$ atoms per cc. in the path of said etching agent.

2. Means for stopping the etching action of KOH in liquid phase in forming a silicon semiconductive element comprising a buried layer of boron doped silicon disposed in the pathway of said etching agent, the surface concentration of boron being at least equal to $5\times10^{19}$ atoms per cc.

3. An etch stop for KOH anisotropic etch comprising a layer of silicon having a doping of boron of at least $5\times10^{19}$ atoms per cc.

4. An etch stop for KOH anisotropic etch comprising silicon having a doping of boron in the range of about $5\times10^{19}$ atoms per cc. to about $3\times10^{20}$ atoms per cc.

5. An etch stop according to claim 4 wherein the surface concentration of boron is about $1\times10^{20}$ atoms per cc.

References Cited

UNITED STATES PATENTS

| | | | |
|---|---|---|---|
| 3,171,762 | 3/1965 | Rutz | 148—175 |
| 3,418,226 | 12/1968 | Marinace | 204—143 |
| 3,429,756 | 2/1969 | Grove | 156—17 |

JACOB H. STEINBERG, Primary Examiner

U.S. Cl. X.R.

148—175; 204—143